(12) United States Patent
Furukawa et al.

(10) Patent No.: US 9,567,667 B2
(45) Date of Patent: Feb. 14, 2017

(54) DUAL-TARGET SPUTTER DEPOSITION WITH CONTROLLED PHASE DIFFERENCE BETWEEN TARGET POWERS

(71) Applicant: TOKYO ELECTRON LIMITED, Tokyo (JP)

(72) Inventors: Shinji Furukawa, Nirasaki (JP); Naoki Watanabe, Nirasaki (JP); Hiroshi Miki, Nirasaki (JP); Tooru Kitada, Nirasaki (JP); Yasuhiko Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 59 days.

(21) Appl. No.: 14/490,410

(22) Filed: Sep. 18, 2014

(65) Prior Publication Data

US 2015/0075971 A1    Mar. 19, 2015

(30) Foreign Application Priority Data

Sep. 18, 2013   (JP) ................. 2013-193310

(51) Int. Cl.
  *C23C 14/34*    (2006.01)
  *H01J 37/34*    (2006.01)
  *C23C 14/08*    (2006.01)

(52) U.S. Cl.
  CPC ........... *C23C 14/3464* (2013.01); *C23C 14/08* (2013.01); *C23C 14/3485* (2013.01); *H01J 37/347* (2013.01); *H01J 37/3417* (2013.01); *H01J 37/3444* (2013.01); *H01J 37/3464* (2013.01)

(58) Field of Classification Search
  CPC .. C23C 14/08; C23C 14/3464; C23C 14/3485; H01J 37/3417; H01J 37/3444; H01J 37/3464; H01J 37/347

USPC ..................................... 204/192.12, 298.08
See application file for complete search history.

(56) References Cited

U.S. PATENT DOCUMENTS

| | | | |
|---|---|---|---|
| 2006/0124455 A1* | 6/2006 | Song | ................... C23C 14/0036 204/298.08 |
| 2007/0158180 A1* | 7/2007 | Ota | ...................... H01J 37/3408 204/192.1 |
| 2013/0237053 A1 | 9/2013 | Ishizaka et al. | |

FOREIGN PATENT DOCUMENTS

| | | |
|---|---|---|
| JP | 02-258976 | * 10/1990 |
| JP | 2006-130425 A | 5/2006 |
| JP | 2012-074522 | 4/2012 |
| JP | 2012/149339 A | 8/2012 |
| KR | 10-2004-0005406 A | 1/2004 |

OTHER PUBLICATIONS

Ishizaka et al., Film Forming Method and Film Forming Device, English Abstract for JP 2012-074522, Apr. 12, 2012, http://www19.ipdl.inpit.go.jp.

* cited by examiner

*Primary Examiner* — Rodney McDonald

(57) ABSTRACT

System and method of insulating film deposition. A sputter deposition chamber comprises a pair of targets made of the same insulating material. Each target is applied with a high frequency power signal concurrently. A phase adjusting unit is used to adjust the phase difference between the high frequency power signals supplied to the pair of targets to a predetermined value, thereby improving the in-plane thickness distribution of a resultant film. The predetermined value is target material specific.

18 Claims, 8 Drawing Sheets

DUAL-TARGET SPUTTER DEPOSITION WITH CONTROLLED PHASE DIFFERENCE BETWEEN TARGET POWERS

CROSS-REFERENCE

This application claims benefit and priority to Japanese Patent Application No. 2013-193310, filed on Sep. 18, 2013, which is herein incorporated by reference in its entirety.

FIELD OF THE INVENTION

Embodiments of the present invention relate to electronic device manufacturing, and more specifically to, thin film deposition apparatuses and methods.

BACKGROUND

Sputtering is the thin film deposition manufacturing process at the core of today's semiconductor, disk drive, CD, and optical device industries. For example, a sputter deposition apparatus includes a plurality of metallic targets. During processing, Ar ions collide with the targets under the impact of a voltage applied on the metallic targets. As a result, a metal layer is formed on the wafer. The sputtering deposition apparatus includes an elevation unit for rotating and vertically moving the mounting table.

Magnetic tunnel junction (MTJ) devices are typically manufactured using sputter deposition technologies. An MTJ device includes a plurality of magnetic layers and the magnetic layers are separated by a tunnel insulating layer. A tunnel insulating layer can be deposited using insulating target sputter deposition technologies.

Conventionally, the in-plane thickness distribution of a deposited film is determined by the various aspects of the mechanical and electrical/magnetic configurations of the sputter deposition chamber. For example, the distances between the targets and the mounting table, the sizes of the targets, the magnetic circuit of a cathode magnet and the like are all factors affecting the film thickness distribution across the wafer. However, it is very expensive and difficult to redesign a hardware component and install it in a sputter deposition apparatus. For example, an elevation unit used to change the distances between the targets and the mounting table is complicated in structure and is costly to design upgrade, manufacture, assemble and install.

SUMMARY OF THE INVENTION

Embodiments of the present disclosure provide a film deposition apparatus and method of controlling in-plane distribution of film thickness of an insulating layer with high manufacturing efficiency.

In accordance with an aspect of the present invention, a physical vapor deposition apparatus comprises a first sputter target coupled to a first high frequency (HF) power signal and a second sputter target coupled to a second HF power signal. The first HF power signal and the second HF power signal are concurrently applied to the first sputter target and the second sputter target respectively during sputter deposition. A phase adjuster is coupled to the first HF power signal and the second HF power signal and configured to adjust a phase difference between the first HF power signal and the second HF power signal to control the in-plane thickness distribution of a deposited film.

In according with another embodiment of the present invention, a method of depositing thin films via sputter deposition comprises: providing a substrate to a process chamber comprising a first sputter target and a second sputter target; supplying a gas flow to the process chamber; concurrently applying a first high frequency (HF) power to the first sputter target and applying a second HF power to the second sputter target; and adjusting a phase difference between the first HF power and the second HF power to a first predetermined value to control a film thickness distribution across the substrate.

In accordin with another embodiment of the present invention, a system comprises a sputter deposition process chamber, a first and a second power supplies, and a phase control unit. The sputter deposition process chamber includes a first sputter target and a second sputter target each comprising a first insulating material, a substrate holder configured to support a planar substrate. The first sputter target and the second sputter target are disposed symmetrically with respect to the planar substrate. The first power supply and the second power supply provide HF powers to the first and the second sputter targets concurrently and respectively. The phase control unit is configured to adjust a phase difference between the first HF power and the second HF power to a first predetermined value.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
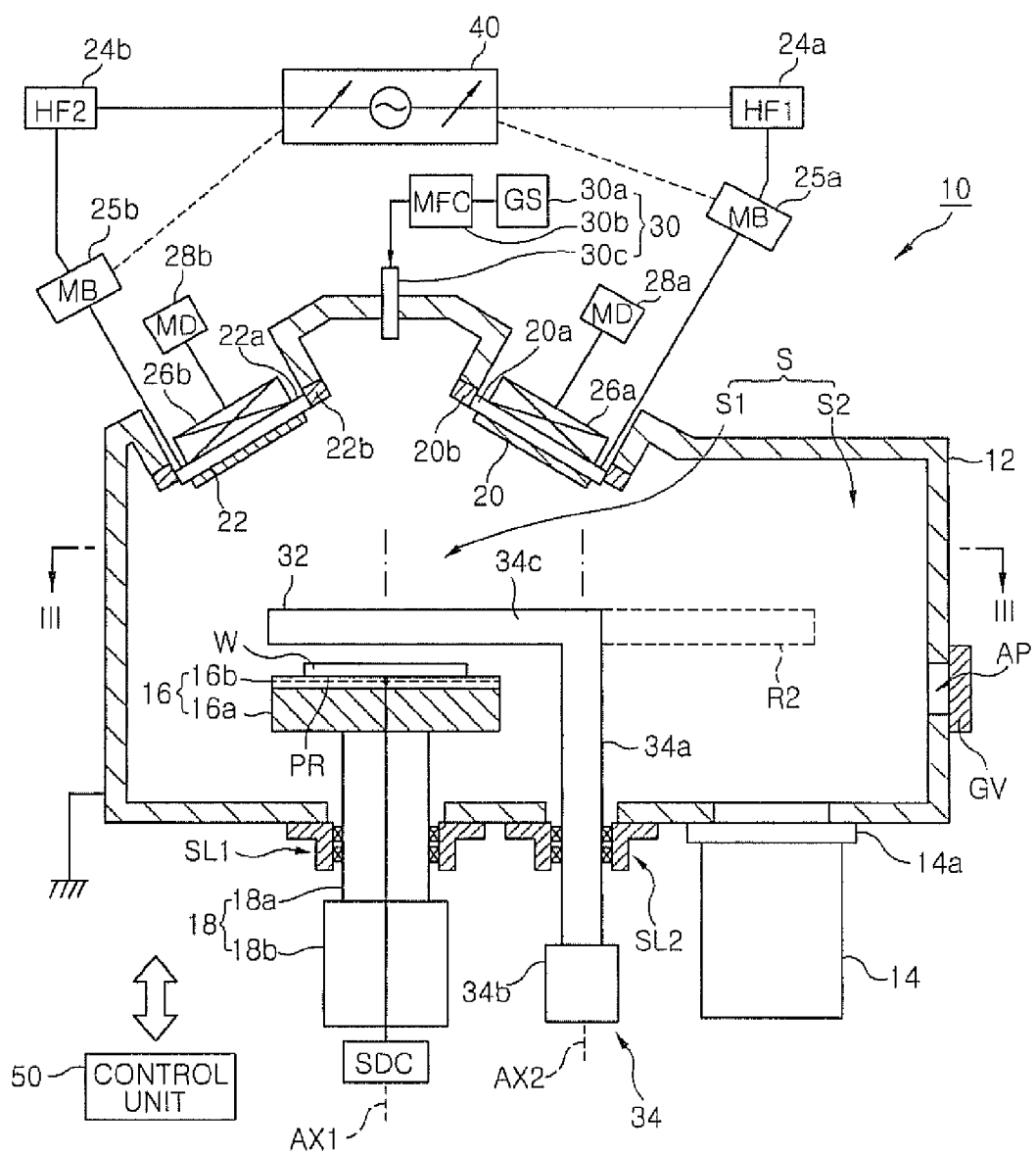
FIGS. 1, 2, 3 and 4 show an exemplary film deposition apparatus having two targets in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, generally refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

Figure 2:
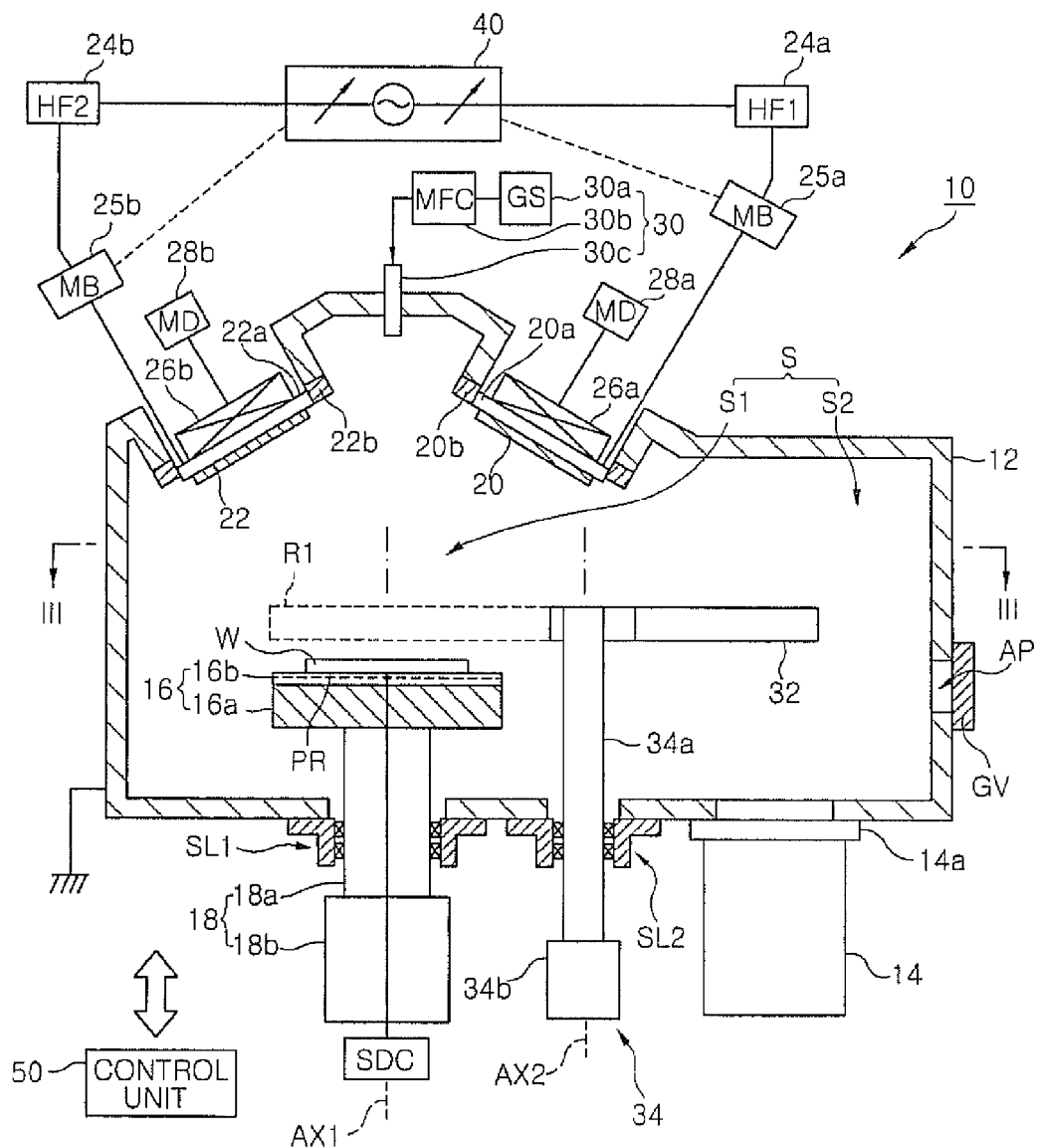
Figure 3:
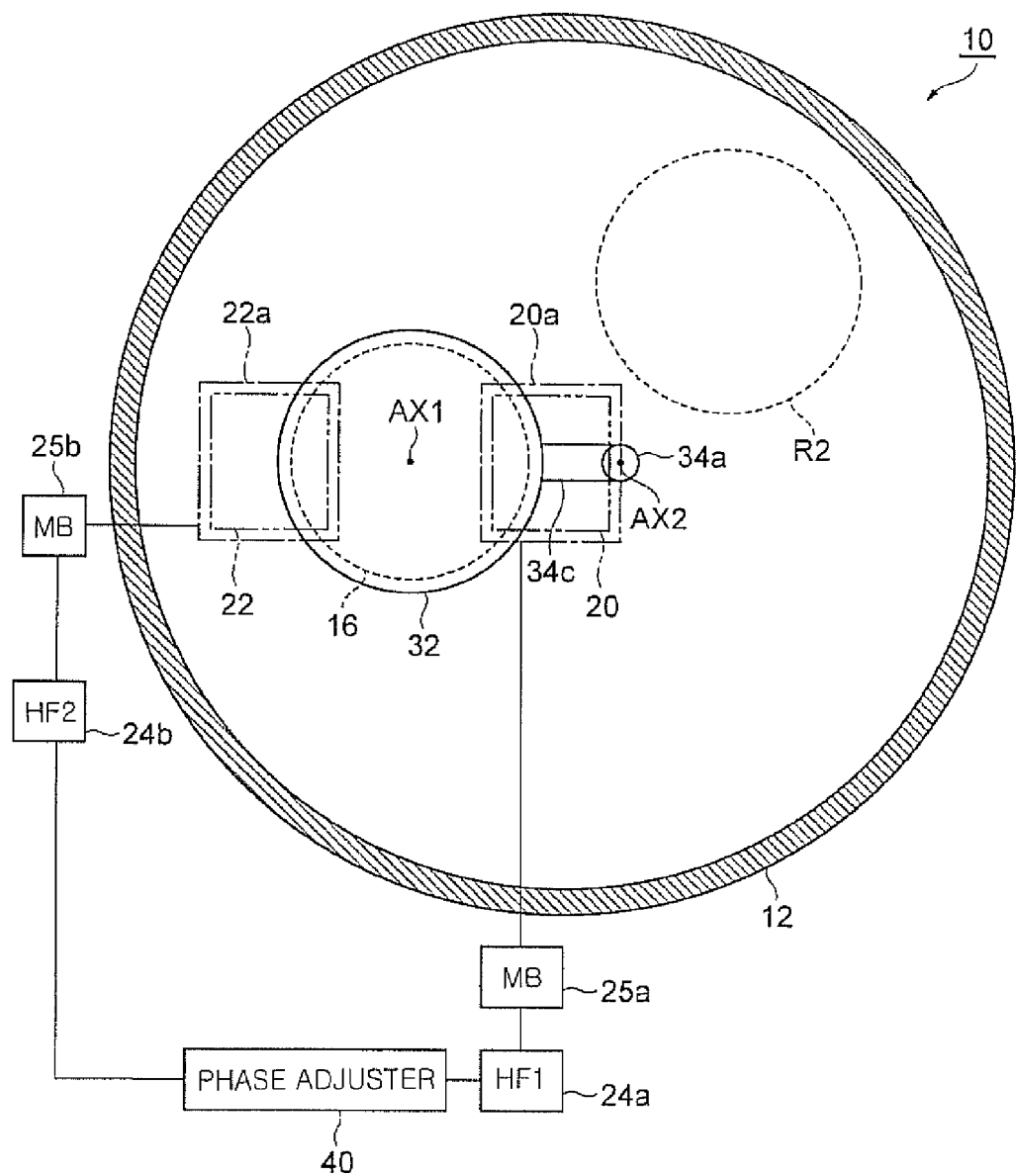
Figure 4:
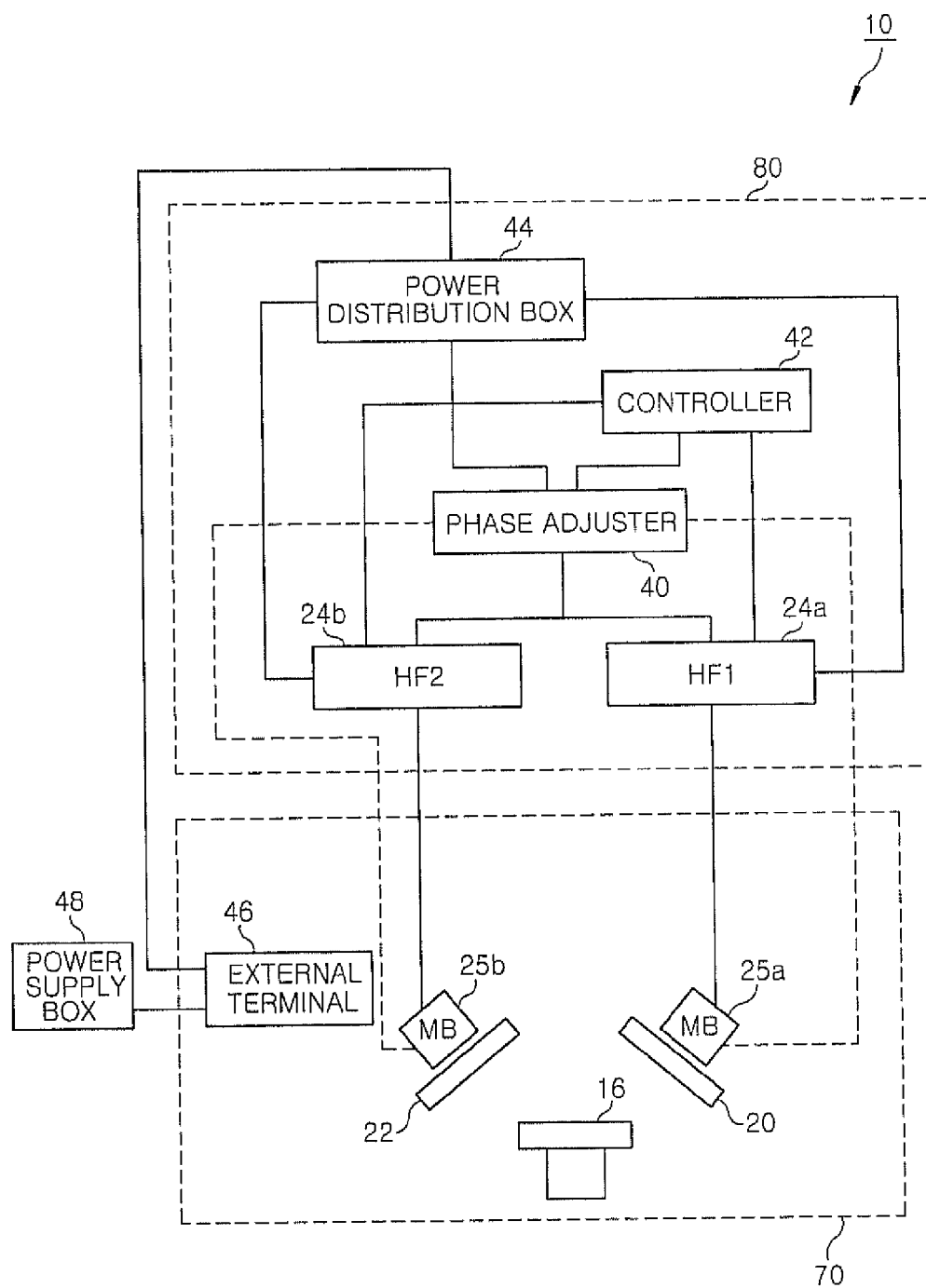

Dual-Target Sputter Deposition with Controlled Phase Difference Between Target Powers FIGS. 1 to 4 show an exemplary film deposition apparatus 10 having two targets in accordance with an embodiment of the present invention. FIGS. 1 and 2 illustrate a vertical cross sectional view of the film deposition apparatus 10 in accordance with an embodiment of the present invention. FIG. 1 illustrates a state in which a shutter 32 in the film deposition apparatus 10 is positioned in a first region, thereby shielding the substrate (W) from deposition even when the target powers are on. FIG. 2 illustrates a state in which the shutter 32 is positioned in a second region where the wafer is exposed for deposition. FIG. 3 is illustrates a view from an axis III-III of FIG. 1. FIG. 4 is a system block diagram of the film deposition apparatus 10 in accordance with an embodiment of the present invention.

The film deposition apparatus 10 shown in FIGS. 1 to 4 is an exemplary sputter deposition apparatus. The film deposition apparatus 10 includes a processing chamber 12 made of, e.g., aluminum, and is frame-grounded. The processing chamber 12 has a space S. A vacuum pump system 14 is coupled to a bottom wall of the processing chamber 12 through an adaptor 14a. Further, an opening AP for transferring a substrate (e.g., the wafer W in this example) to the processing chamber 12 is disposed at a sidewall of the chamber 12. A gate valve GV for opening/closing the opening AP is placed on the sidewall.

A mounting table 16 is installed in the processing chamber 12. The mounting table 16 includes a base 16a and an electrostatic chuck 16b. The base 16a is made of, e.g., aluminum, stainless steel or the like, and is substantially disc shaped. A temperature control mechanism is included in the base 16a, e.g., a coolant path through which a coolant circulates to cool off the mounting table 16 and/or the substrate.

The electrostatic chuck 16b is coupled to the base 16a. The electrostatic chuck 16b has a dielectric layer and an electrode embedded therein. A DC power supply SDC is coupled to the electrode of the electrostatic chuck 16b. The wafer W sitting on the electrostatic chuck 16b is attracted and held firmly to the electrostatic chuck 16b by electrostatic force generated by the electrostatic chuck 16b. Further, a region on the surface of the electrostatic chuck 16b where the wafer W is mounted serves as a mounting region PR of the wafer W.

The mounting table 16 is coupled to a rotation driving mechanism 18. The rotation driving mechanism 18 includes a supporting shaft 18a and a driving unit 18b. The supporting shaft 18a is coupled to the mounting table 16 and extends to the outside of the processing chamber 12. A sealing member SL1 is used to form the vacuum seal between the supporting shaft 18a and the bottom wall of the processing chamber 12. The sealing member SL1 may be, e.g., a magnetic fluid seal.

The supporting shaft 18a has one end coupled to the mounting table 16 and the other end coupled to the driving unit 18b. The driving unit 18b drives the supporting shaft 18a and the mounting table 16 to rotate about a first axis AX1.

A first target 20 and a second target 22, which are made of the same material, are installed above the mounting table 16. In this example, the target material is an insulating material. In some embodiments, the target material is a metal oxide insulating material, such as magnesium oxide, aluminum oxide, titanium oxide, nickel oxide, gallium oxide, silver oxide, or any other type of suitable insulating material. The target material is selected based on the insulating layer (or film) to be formed on the wafer. The target 20 is held in position by a metallic holder 20a installed at the top portion of the processing chamber 12 through an insulating member 20b. The target 22 is held by a metallic holder 22a installed at the top portion of the processing chamber 12 through an insulating member 22b.

The targets 20 and 22 are positioned substantially symmetrically with respect to a virtual vertical plane including the first axis AX1. The targets 20 and 22 are shaped like a plate. When viewed from a thickness direction, the targets have a rectangular shape. Further, the targets 20 and 22 are inclined toward the first axis AX1. The first axis AX1 serves as a central axis of the mounting table 16 and the mounting region PR which extends vertically through a center of the mounting table 16 and also serves as a rotational axis of the mounting table 16.

A first high frequency power supply (HF1) 24a is coupled to the target 20 via the holder 20a and a matching box (MB) (e.g., an impedance matching unit) 25a. A second high frequency power supply (HF2) 24b is coupled to the target 22 via the holder 22a and a matching box (MB) 25b. The first high frequency power supply 24a and the second high frequency power supply 24b supply RF powers for example. A cathode magnet 26a is installed outside the processing chamber 12 and coupled to the target 20 via the holder 20a. A cathode magnet 26b is installed outside the processing chamber 12 and coupled to the target 22 via the holder 22a. The cathode magnets 26a and 26b are coupled to magnet driving units (MD) 28a and 28b, respectively.

The film deposition apparatus 10 further includes a first gas supply unit 30 for supplying gas into the processing chamber 12. In the present embodiment, the gas supply unit 30 has a gas source (GS) 30a, a flow rate controller 30b such as a mass flow controller (MFC), and a gas inlet 30c. The gas source 30a is a source of gas to be excited in the processing chamber 12, e.g., Ar. The gas source 30a is coupled to the gas inlet 30c via the flow rate controller 30b. The gas inlet 30c introduces a gas flow from the gas source 30a into the processing chamber 12. In the present embodiment, the gas inlet 30c extends along the first axis AX1.

When the gas is supplied to the processing chamber and the high frequency power P1 and P2 are applied to the targets 20 and 22, a gaseous plasma can be generated. The magnetic field generated from the magnets 26a and 26b confines the plasma in the vicinity of the targets 20 and 22. The magnets 26a and 26b are driven by the magnet driving units 28a and 28b, respectively. Then, positive ions from the plasma bombard the targets 20 and 22, and sputter off the target material atoms. As a result, the sputtered material is deposited and forms an insulating layer on the wafer W. Such an insulating layer may serve as a tunnel insulating layer of an MTJ device.

The film deposition apparatus 10 includes a phase adjuster 40 for controlling a phase difference $\Phi a$ between the first high frequency power P1 and the second high frequency power P2. The phase adjuster 40 can control the phase difference $\Phi a$ in the following exemplary method. First, the phases of the first and the second high frequency power P1 and P2 are read out from the matching boxes 25a and 25b, respectively. Next, one of the first and the second high frequency power P1 and P2 is fixed in phase and the other one is adjusted in phase to obtain a desired phase difference between the two power supplies. Then, a phase shift command is transmitted to at least one of the first and the second high frequency power supply 24a and 24b. The phase difference $\Phi a$ is adjusted in the unit of 1° for instance.

As shown in FIG. 4, the phase adjuster 40, the first high frequency power supply 24a and the second high frequency power supply 24b are coupled to a controller 42 and a power distribution box 44, e.g., through RF communication cables or links. The phase adjuster 40, the first high frequency power supply 24a, the second high frequency power supply 24b, the controller 42 and the power distribution box 44 are members of a control module 80. A power supply box 48 is coupled to the power distribution box 44 via an external terminal 46 of the processing chamber 12. The external terminal 46, the matching boxes 25a and 25b, the targets 20 and 22, and the mounting table 16 are members of a film deposition module 70.

As shown in FIGS. 1 and 2, the film deposition apparatus 10 includes a control unit 50 for controlling various components of the film deposition apparatus 10. The control unit 50 controls the phase adjuster 40 so that a desired phase difference value $\Phi 1$ can be achieved. $\Phi 1$ is related to the target material and can be determined through process development for example. The control unit 50 includes the controller 42 shown in FIG. 4. The control unit 50 may include a storage unit storing a deposition process recipe which includes the phase difference as a processing parameter and $\Phi 1$ as its value.

The film deposition apparatus 10 further includes a shutter 32. The shutter 32 shields the wafer W from deposition of the target material sputtered from the targets 20 and 22.

The shutter 32 is pivotally supported by head driving mechanism 34. In the present embodiment, the head driving mechanism 34 includes a supporting shaft 34a and a driving unit 34b. The supporting shaft 34a extends along a second axis AX2. The second axis AX2 is substantially parallel to the first axis AX1 and extends vertically at a side of the mounting table 16. In the present embodiment, the shutter 32 is approximately disc shaped. The distance between the center of the shutter 32 and the second axis AX2 is substantially equal to the distance between the first axis AX1 and the second axis AX2.

The supporting shaft 34a extends from the inside of the processing chamber 12 to the outside of the processing chamber 12. A sealing member SL2 is provided between the supporting shaft 34a and the bottom wall of the processing chamber 12. The sealing member SL2 seals the gap between the bottom wall of the processing chamber 12 and the supporting shaft 34a while allowing rotation of the supporting shaft 34a. The sealing member SL2 may be, e.g., a magnetic fluid seal.

An upper end of the supporting shaft 34a is coupled to one end of a connection portion 34c extending in a direction perpendicular to the second axis AX2. The other end of the connection portion 34c is coupled to a peripheral portion of the shutter 32. Further, a lower end of the supporting shaft 34a is coupled to the driving unit 34b. The driving unit 34b drives the supporting shaft 34a to rotate. The shutter 32 rotates about the second axis AX2 with the supporting shaft 34a.

Specifically, the shutter 32 can move between a region R1 and a region R2 by the operation of the driving mechanism 34. The region R1 is defined above the mounting table 16 and inside a space S1 between the targets 20 and 22 and the mounting table 16. In other words, the region R2 is defined inside a space S2 different from the space S1.

Figure 5A:
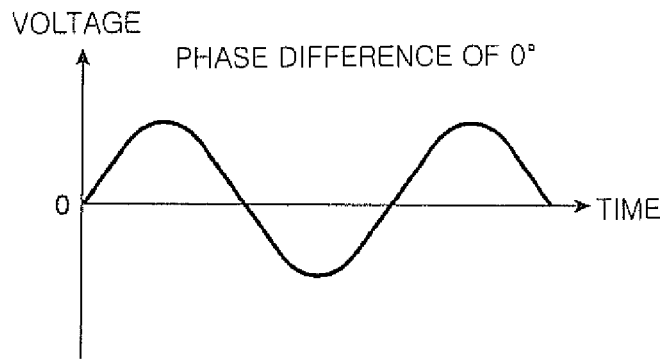
FIGS. 5A, 5B and 5C show sample waves of a first and a second high frequency power in accordance with an embodiment of the present invention.
Figure 5B:
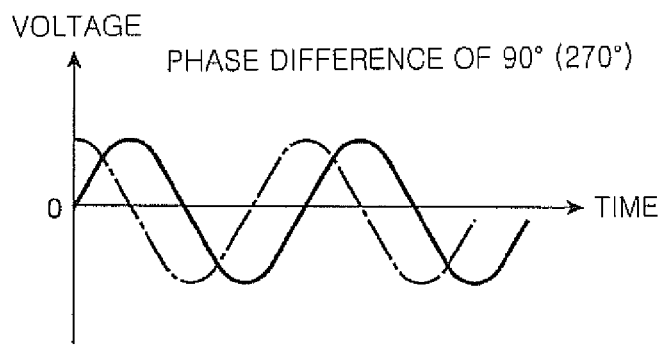
Figure 5C:
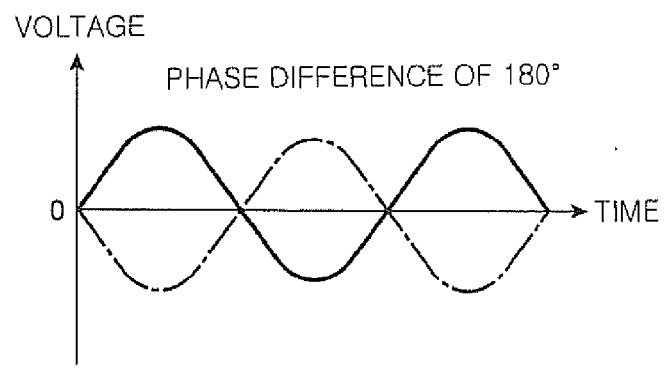

Through a deposition process, an insulating layer composed of the target material can be formed on the wafer W. It has been observed that the in-plane distribution of the film thickness is a function of the phase difference $\Phi a$ between the first high frequency power (or first frequency power signal) P1 and the second high frequency power (or second frequency power signal) P2. FIGS. 5A to 5C show sample waves of the first and the second high frequency powers P1 and P2. FIG. 5A shows a sine wave of the first and the second high frequency powers P1 and P2 having a phase difference $\Phi a$ of 0°. FIG. 5B shows the sine waves of the first and the second high frequency powers P1 and P2 having a phase difference $\Phi a$ of 90° (or 270°). FIG. 5C shows sine waves of the first and the second high frequency powers P1 and P2 having a phase difference $\Phi a$ of 180°.

Figure 6:
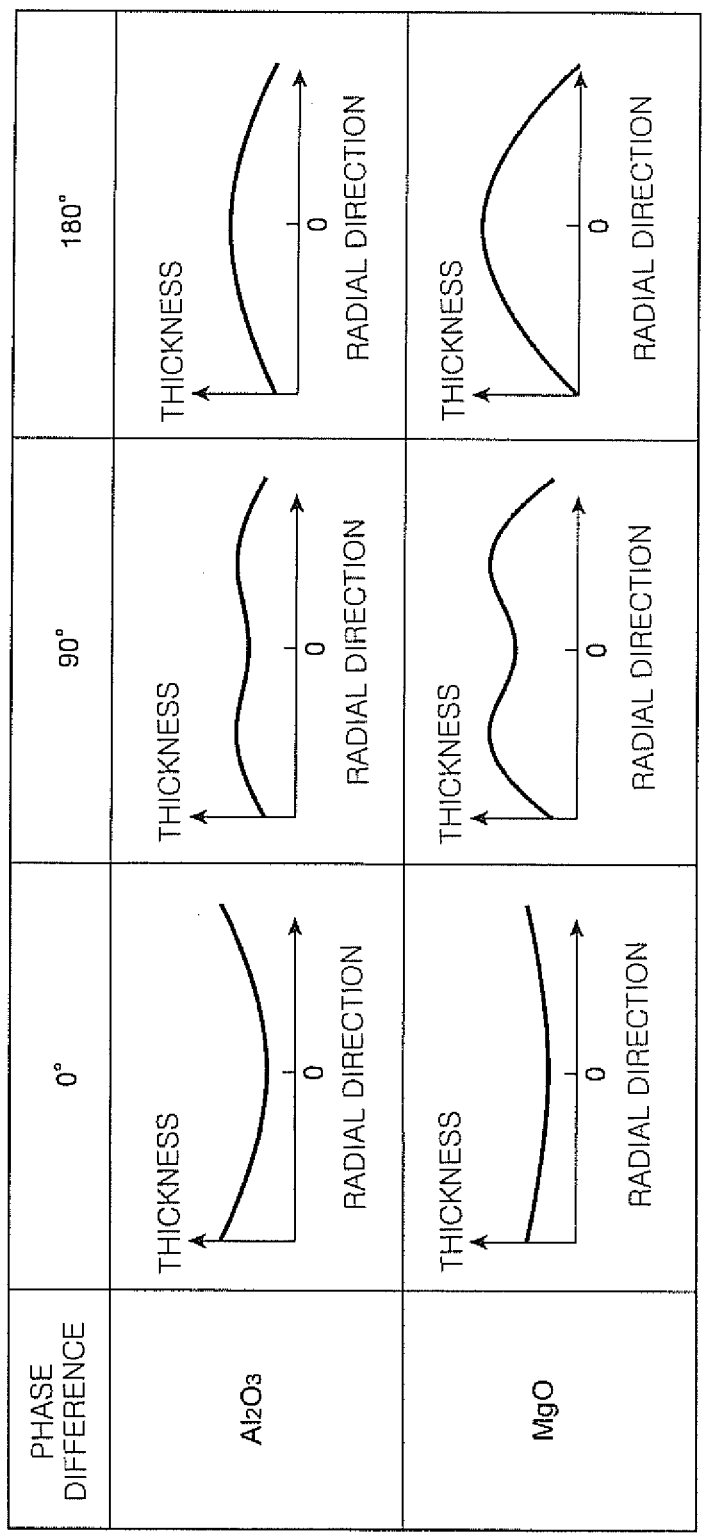
FIG. 6 shows exemplary relationship between film thickness distribution and phase difference.

FIG. 6 shows exemplary relationships between the radial film thickness distribution and the phase difference for different target materials in accordance with an embodiment of the present disclosure. For example, when the phase difference $\Phi a$ is 0°, the film thickness increases from the center toward the edge of the wafer W. When the phase difference $\Phi a$ is 180°, the film thickness decreases from the center toward the edge of the wafer W. When the phase difference $\Phi a$ is 90°, the film thickness first increases and then decreases from the center toward the edge of the wafer W. The films are deposited while the wafers are rotated, so the film thickness distribution profiles are substantially the same in all radial directions. FIG. 6 shows that the variation trends of radial thickness are independent of the target material, but the amounts of variation depend on the target material. For example, when the phase difference $\Phi a$ is 0°, the variation in thickness is greater in $Al_2O_3$ than in MgO. When the phase difference $\Phi a$ is 90° and 180°, the variation in thickness is smaller in $Al_2O_3$ than in MgO.

Therefore, in the film deposition apparatus 10, the in-plane distribution of the film thickness can be advantageously controlled by adjusting the phase difference Φa and without changing the apparatus mechanical configurations. In one embodiment, a deposition apparatus according to the present disclosure does not need an elevation mechanism for vertically moving the mounting table 16 to change the throw distance. Accordingly, the structure of the film deposition apparatus 10 can be simplified, and the manufacturing cost of the apparatus 10 can be reduced. Further, for a specific target material, a phase difference value Φ1 can be determined to optimize the in-plan thickness distribution. Thus, the in-plane distribution of the film thickness can be simply controlled by adjusting processing conditions (e.g., by using a different process recipe) even if a different type of target material is used.

Figure 7:
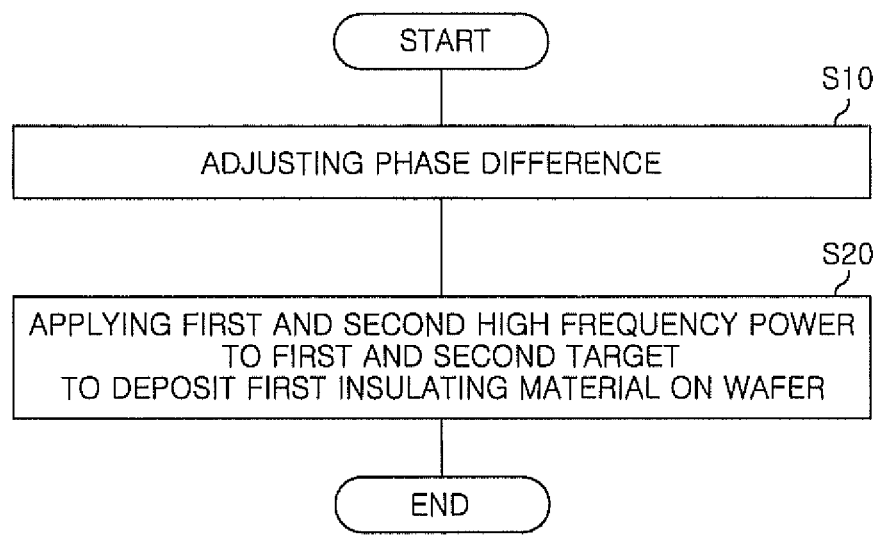
FIG. 7 is a flowchart showing an exemplary film deposition method in accordance with the embodiment of the present invention.

FIG. 7 is a flowchart showing an exemplary sputter deposition method in accordance with an embodiment of the present invention. At S10, the phase difference Φa between the first high frequency power P1 and the second high frequency power P2 is adjusted by the phase adjuster 40. At S20, the first high frequency power P1 and the second high frequency power P2 are applied to the targets 20 and 22, respectively. During processing, the target material is sputtered from the targets 20 and 22 and is deposited onto the wafer W.

To adjust the phase difference between P1 and P2, the phases of the first and the second high frequency power P1 and P2 are read out from the matching boxes 25a and 25b, respectively. One of the read-out phases of the first and the second high frequency power P1 and P2 is fixed, and the other one is shifted to obtain desired phase difference Φa. Then, a phase shift command is transmitted to at least one of the first and the second high frequency power supply 24a and 24b. The control unit 50 may control the phase adjuster 40 such that the phase difference Φa becomes the value Φ1. The value Φ1 is determined in advance according to the type of the target material.

The wafer W is transferred into the processing chamber 12 and mounted on the mounting table 16. A pressure in the space S is set to a predetermined level by the vacuum pump system 14. Then, the mounting table 16 is rotated by the driving mechanism 18. A gas is supplied from the first gas supply unit 30 into the processing chamber 12, and the first and the second high frequency power P1 and P2 are applied to the targets 20 and 22, respectively. Further, a magnetic field is generated by the magnets 26a and 26b. The shutter 32 is positioned in the region R2 (see FIG. 2).

During processing, positive ions from the plasma bombard the targets 20 and 22 and sputter off the target material atoms which can be deposited on the wafer W.

The present disclosure is not limited by the number of targets, target material, film composition, or gas used in a sputter deposition apparatus. For example, a film deposition apparatus according to the present disclosure may include three or more pairs of targets, e.g., each pair made of a different material. Further, the present disclosure is not limited to any specific hardware configuration of a sputter deposition apparatus or any specific frequency of the high frequency powers.

Figure 8:
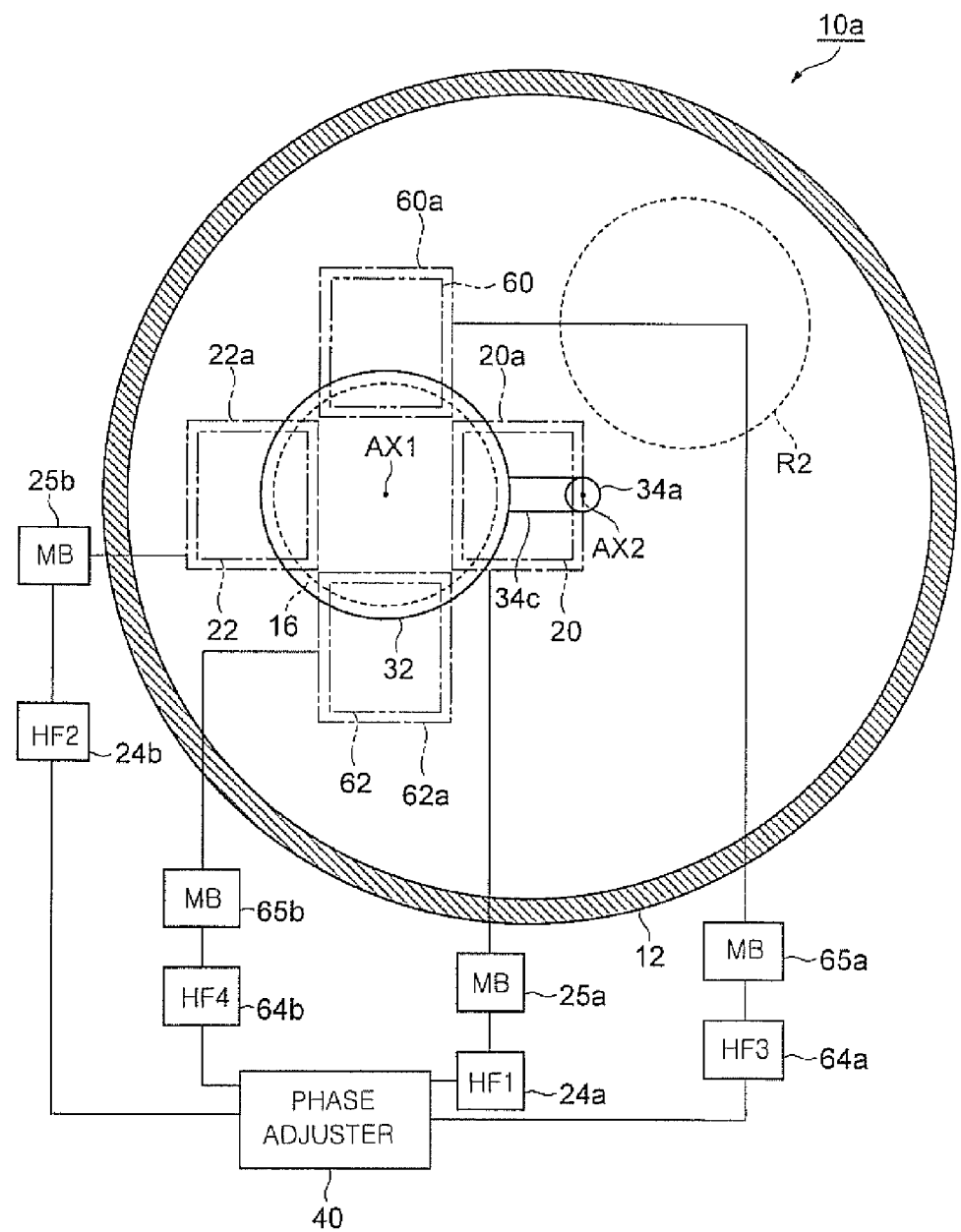
FIG. 8 shows an exemplary film deposition apparatus having four targets in accordance with another embodiment of the present invention.

FIG. 8 shows an exemplary film deposition apparatus with four targets in accordance with another embodiment of the present invention. The apparatus 10a shown in FIG. 8 includes, in addition to the components of the film deposition apparatus 10, a third target 60, a third high frequency power supply 64a, a fourth target 62 and a fourth high frequency power supply 64b. The observation direction of the film deposition apparatus 10a in FIG. 8 is the same as that of the film deposition apparatus 10 in FIG. 3.

A pair of targets 60 and 62 made of the same material are installed above the mounting table 16. The geometry of the targets 60 and 62 is identical to that of the targets 20 and 22, but the targets 60 and 62 are made of a different target material (hereinafter "second target material") from the target material used for targets 20 and 22 (hereinafter "the first target material"). In one embodiment, the first and second target materials are both insulating materials. However, in some embodiments, the second target material may be identical to the first target material.

Further, the targets 60 and 62 are selected according to the insulating layer to be formed. The target 60 is held by a metallic holder 60a. The holder 60a is installed at a top portion of the processing chamber 12 via an insulating member. The target 62 is held by a metallic holder 62a. The holder 62a is supported at a top portion of the processing chamber 12 via an insulating member.

The targets 60 and 62 are positioned substantially symmetrical with respect to a virtual vertical plane including the first axis AX1. This virtual vertical plane is perpendicular to the virtual vertical plane including the first axis AX1 between the targets 20 and 22. The targets 60 and 62 are inclined upward toward the first axis AX1.

A third high frequency power supply (HF3) 64a is coupled to the target 60 via the holder 60a and a matching box (MB) 65a. A fourth high frequency power supply (HF4) 64b is coupled to the target 62 via the holder 62a and a matching box (MB) 65b. Similar to the deposition apparatus 10, a cathode magnet is installed outside the processing chamber 12 and adjacent to the target 60 via the holder 60a. Further, a cathode magnet is installed outside the processing chamber 12 and adjacent to the target 62 via the holder 62a. The cathode magnets are coupled to the magnet driving units.

The third high frequency power supply 64a generates a third high frequency power P3 applied to the third target 60. The fourth high frequency power supply 64b generates a fourth high frequency power P4 applied to the fourth target 62. A phase difference Φb between the third high frequency power P3 and the fourth high frequency power P4 can be adjusted by the phase adjuster 40. The control unit 50 may control the phase adjuster 40 to achieve a phase difference Φb=Φ2. Φ2 can be determined in advance according to the type of the second target material. The control unit 50 may include a storage unit storing a process recipe including the phase difference parameter Φb with the value equal to Φ2. A deposited film composed of the second target material can be produced using the process recipe.

When the targets 20 and 22 are in use and the targets 60 and 62 remain unpowered, the apparatus 10a may function similarly as the apparatus 10 and produce films composed of the first target material. In the film deposition apparatus 10a, a film composed of the second target material can be deposited onto a film composed of the first target material.

Conventionally, when a plurality of insulating layers of different material compositions are formed in the same processing chamber, the hardware components of the film deposition apparatus need to be changed according to the type of the insulating material in order to improve film thickness distribution. However, in a film deposition apparatus according to the present disclosure, the film distribution can be controlled by adjusting the phase difference Φb between the third high frequency power P3 and the fourth high frequency power P4, which does not involve changing the hardware. Therefore, the hardware of the film deposition apparatus 10a does not need to be changed even in the case of forming a plurality insulating layers of different compositions in the same processing chamber 12.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A physical vapor deposition apparatus comprising:
    a first sputter target comprising a first target material and coupled to a first high frequency (HF) power signal;
    a second sputter target coupled to a second HF power signal, wherein the first HF power signal and the second HF power signal are concurrently applied to said first sputter target and said second sputter target respectively; and
    a phase adjuster coupled to said first HF power signal and said second HF power signal and configured to adjust a phase difference between said first HF power signal and said second HF power signal,
    wherein said first HF power signal is generated by a first power supply, wherein said second HF power signal is generated by a second power supply, and wherein further said phase adjuster is configured to adjust said phase difference between said first HF power signal and said second HF power signal to a first predetermined value which is dependent on said first target material.

2. The physical vapor deposition apparatus of claim 1, wherein said first target and said second target have a same geometry and comprise said first target material.

3. The physical vapor deposition apparatus of claim 2, wherein said first target material comprises an insulating material selected from a group consisting of: magnesium oxide; aluminum oxide; titanium oxide; nickel oxide; gallium oxide; and silver oxide.

4. The physical vapor deposition apparatus of claim 1 further comprising a mounting table configured to support a planar substrate subject to a sputter deposition, wherein said first predetermined value is determined based on a desired in-plane film thickness distribution across said planar substrate.

5. The physical vapor deposition apparatus of claim 1 further comprising:
    a third sputter target;
    a fourth sputter target, wherein said third and fourth sputter targets comprise a second target material that is different from said first target material;
    a third power supply configured to provide a third HF power signal to said third sputter target; and
    a fourth power supply configured to provide a fourth HF power signal to said fourth sputter target concurrently with said third power supply providing said third HF power signal to said third sputter target,
    wherein said phase adjuster is configured to adjust a phase difference between said third HF power signal and said fourth HF power signal to a second predetermined value.

6. A method of depositing thin films via sputter deposition, said method comprising:
    providing a substrate to a process chamber comprising a first sputter target comprising a first target material and a second sputter target;
    supplying a gas flow to said process chamber;
    concurrently applying a first high frequency (HF) power signal to said first sputter target and applying a second HF power signal to said second sputter target; and
    adjusting a phase difference between said first HF power signal and said second HF power signal to a first predetermined value to control a film thickness distribution across said substrate,
    wherein said first HF power signal is generated by a first power supply, wherein said second HF power signal is generated by a second power supply, and wherein further said phase adjuster is configured to adjust said phase difference between said first HF power signal and said second HF power signal to said first predetermined value which is dependent on said first target material.

7. The method of claim 6, wherein said first target and said second target have a same geometry and comprise said first target material.

8. The method of claim 7, wherein said first target material is an insulating material selected from a group consisting of: magnesium oxide; aluminum oxide; titanium oxide; nickel oxide; gallium oxide; and silver oxide.

9. The method of claim 7 further comprising determining said first predetermined value based on said first target material via a film deposition process development method.

10. The method of claim 6, wherein said process chamber further comprises a third sputter target and a fourth sputter target, and further comprising:
    turning off said first HF power signal and said second HF power signal;
    concurrently applying a third HF power signal to said third sputter target and applying a fourth HF power signal to said fourth sputter target; and
    adjusting a phase difference between said third HF power signal and said fourth HF power signal to a second predetermined value to control a film thickness distribution across said substrate.

11. The method of claim 10, wherein said third sputter target and said fourth sputter target comprise a second target material that is different from said first target material.

12. The method of claim 6, wherein said adjusting comprises:
    preserving a phase of said first HF power signal; and
    adjusting a phase of said second HF power signal.

13. A system comprising:
    a sputter deposition process chamber comprising:
        a first sputter target and a second sputter target each comprising a first insulating material; and
        a substrate holder configured to support a planar substrate, wherein said first sputter target and said second sputter target are disposed symmetrically with respect to said planar substrate;
    a first power supply configured to provide a first high frequency (HF) power signal to said first sputter target;
    a second power supply configured to provide a second HF power signal to said second sputter target concurrently with said first power supply providing said first HF power to said first sputter target; and
    a phase control unit coupled to said first power supply and second power supply and configured to adjust a phase difference between said first HF power signal and said second HF power signal to a first predetermined value which is dependent on said first target material.

14. The system of claim 13; wherein said first target material is an insulating material selected from a group consisting of: magnesium oxide; aluminum oxide; titanium oxide; nickel oxide; gallium oxide, and silver oxide.

15. The system of claim 14,
wherein said a first predetermined value is determined based on a desired film thickness distribution across said planar substrate.

16. The system of claim 13, wherein said sputter deposition process chamber further comprises a third sputter target and a fourth sputter target; wherein said third and fourth sputter targets each comprise a second target material that is different from said first target material; and further comprising:
- a third power supply configured to provide a third HF power signal to said third sputter target; and
- a fourth power supply configured to provide a fourth HF power signal to said fourth sputter target concurrently with said third power supply providing said third HF power signal to said third sputter target;
- wherein said phase control unit is configured to adjust a phase difference between said third HF power signal and said fourth HF power signal to a second predetermined value.

17. The system of claim 13, wherein said first HF power signal and said second HF power signal are radio frequency (RF) powers.

18. The system of claim 13; wherein said phase control unit is configured to preserve a phase of said first HF power signal and vary a phase of said second HF power signal according to said first predetermined value.

\* \* \* \* \*